(12) United States Patent  (10) Patent No.: US 11,887,515 B2
Zhang et al.  (45) Date of Patent: Jan. 30, 2024

(54) DISPLAY PANEL, CRACK DETECTION METHOD THEREFOR, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Hao Zhang, Beijing (CN); Tingliang Liu, Beijing (CN); Huijuan Yang, Beijing (CN); Yang Zhou, Beijing (CN); Yu Wang, Beijing (CN); Xin Zhang, Beijing (CN); Xiaofeng Jiang, Beijing (CN); Yupeng He, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 9 days.

(21) Appl. No.: 17/764,991

(22) PCT Filed: May 27, 2021

(86) PCT No.: PCT/CN2021/096392
§ 371 (c)(1),
(2) Date: Mar. 30, 2022

(87) PCT Pub. No.: WO2021/249199
PCT Pub. Date: Dec. 16, 2021

(65) Prior Publication Data
US 2023/0027375 A1 Jan. 26, 2023

(30) Foreign Application Priority Data
Jun. 11, 2020 (CN) .......................... 202010529509.0

(51) Int. Cl.
*G06F 3/041* (2006.01)
*G09G 3/00* (2006.01)
*G09G 3/3225* (2016.01)

(52) U.S. Cl.
CPC ........... *G09G 3/006* (2013.01); *G06F 3/0412* (2013.01); *G06F 2203/04102* (2013.01); *G09G 3/3225* (2013.01); *G09G 2330/12* (2013.01)

(58) Field of Classification Search
None
See application file for complete search history.

(56) References Cited

U.S. PATENT DOCUMENTS

| 2016/0351093 A1 | 12/2016 | Kim et al. |
| 2018/0158894 A1 | 6/2018 | Park et al. |

(Continued)

FOREIGN PATENT DOCUMENTS

| CN | 104240625 A | 12/2014 |
| CN | 106206654 A | 12/2016 |

(Continued)

OTHER PUBLICATIONS

Translation of CN 108831362 A into English; Yang et al. (Year: 2018).*

(Continued)

*Primary Examiner* — Brian M Butcher
(74) *Attorney, Agent, or Firm* — Ling Wu; Stephen Yang; Ling and Yang Intellectual Property

(57) ABSTRACT

A display panel, crack detection method therefor, and display device. The display panel comprises a display area (100) provided with at least one first data line (101) and at least one second data line (102), and peripheral area (200) surrounding the display area and provided with a first crack detection line, second crack detection line, first detection switch circuit (51), and second detection switch circuit (52);

(Continued)

the first crack detection line and second crack detection line are in different functional layers; the first crack detection line has a first end (A) electrically connected to a first test end and a second end (C) electrically connected to first detection switch circuit; the second crack detection line has a first end (B1) electrically connected to a third node (B) that is different from the first end (A) and second end (C), and a second end (A1) electrically connected to second detection switch circuit.

17 Claims, 8 Drawing Sheets

(56) References Cited

U.S. PATENT DOCUMENTS

| | | | |
|---|---|---|---|
| 2018/0182274 | A1 | 6/2018 | Jung et al. |
| 2019/0213935 | A1 | 7/2019 | Jung |

FOREIGN PATENT DOCUMENTS

| | | | | | |
|---|---|---|---|---|---|
| CN | 108153017 | A | | 6/2018 | |
| CN | 108417561 | A | | 8/2018 | |
| CN | 108831362 | A | * | 11/2018 | ............ G09G 3/006 |
| CN | 108922909 | A | | 11/2018 | |
| CN | 110021641 | A | | 7/2019 | |
| CN | 209764965 | U | | 12/2019 | |
| CN | 110993659 | A | | 4/2020 | |
| CN | 111048021 | A | | 4/2020 | |
| CN | 111256957 | A | | 6/2020 | |
| CN | 111564130 | A | | 8/2020 | |

OTHER PUBLICATIONS

Office Action dated Oct. 27, 2022 for Chinese Patent Application No. 202010529509.0 and English Translation.
International Search Report for PCT/CN2021/096392 dated Aug. 27, 2021.

* cited by examiner

DISPLAY PANEL, CRACK DETECTION METHOD THEREFOR, AND DISPLAY DEVICE

CROSS-REFERENCE TO RELATED APPLICATIONS

The present application is a U.S. National Phase Entry of International Application No. PCT/CN2021/096392 having an international filing date of May 27, 2021, which claims priority to Chinese patent application No. 202010529509.0 entitled "Display Panel, Crack Detection Method Therefor, and Display Device" and filed to the CNIPA on Jun. 11, 2020. The above-identified applications are hereby incorporated into the present disclosure by reference in their entirety.

TECHNICAL FIELD

Embodiments of the present disclosure relate to, but are not limited to, display technologies, and particularly to a display panel, a crack detection method therefor, and a display device.

BACKGROUND

With the rapid development of Active Matrix Organic Light-Emitting Diode (AMOLED) in the field of display, it is extremely urgent to improve the yield. Since an AMOLED substrate is made of a material with relatively high flexibility, tiny cracks tend to be formed in an edge of a flexible panel. It is known to us that an organic light-emitting diode technology is used for flexible display, water and oxygen may produce a destructive chemical reaction for an organic light-emitting diode, and the existence of the cracks provide paths for water and oxygen, finally resulting in the formation of dark spots in a light emitting area and even a series of problems such as a material failure and the reduction of the service life.

A Flexible Multi-Layer On Cell (FMLOC) technology integrates a screen and touch control such that the integration level of a display device is improved greatly. The FMLOC technology has become a development trend of the display industry. When the FMLOC technology is used, both a substrate and FMLOC may have cracks.

SUMMARY

The following is a summary about the subject matter described in the present disclosure in detail. The summary is not intended to limit the scope of protection of the claims.

In an aspect, an embodiment of the present disclosure provides a display panel, including a display region and a peripheral region surrounding the display region, wherein at least one first data line and at least one second data line are arranged in the display region, a crack detection circuit structure is arranged in the peripheral region, the crack detection circuit structure includes a first crack detection line, a second crack detection line, a first detection switch circuit electrically connected with the first data line, and a second detection switch circuit electrically connected with the second data line, the display panel includes multiple function layers sequentially arranged on a plane perpendicular to a display surface of the display panel, and the first crack detection line and the second crack detection line are arranged in different function layers.

A first terminal of the first crack detection line is configured to be electrically connected with a first test terminal, a second terminal of the first crack detection line is electrically connected with an input terminal of the first detection switch circuit, and an output terminal of the first detection switch circuit is electrically connected with the first data line.

A first terminal of the second crack detection line is electrically connected with a third node of the first crack detection line, the third node is different from the first terminal and second terminal of the first crack detection line, a second terminal of the second crack detection line is electrically connected with an input terminal of the second detection switch circuit, and an output terminal of the second detection switch circuit is electrically connected with the second data line.

A control terminal of the first detection switch circuit and a control terminal of the second detection switch circuit are configured to be electrically connected with a second test terminal.

In an exemplary embodiment, the peripheral region includes a first region with a bonding region, a second region arranged opposite to the first region, and a third region and fourth region that are connected with the first region and the second region and arranged opposite to each other; the first terminal and second terminal of the first crack detection line are located in the first region; the first crack detection line is located in the first region, the second region, and the third region; and the first terminal of the second crack detection line is located in the second region, while the second terminal is located in the first region, and the second crack detection line is located in the first region, the second region, and the third region.

In an exemplary embodiment, on a plane parallel to the display surface of the display panel, an orthogonal projection of the first crack detection line includes an orthogonal projection of the second crack detection line.

In an exemplary embodiment, at least one third data line and at least one fourth data line are further arranged in the display region, the crack detection circuit structure further includes a third crack detection line, a fourth crack detection line, a third detection switch circuit electrically connected with the third data line, and a fourth detection switch circuit electrically connected with the fourth data line, and the third crack detection line and the fourth crack detection line are arranged in different function layers of the display panel.

A first terminal of the third crack detection line is electrically connected with a third test terminal, a second terminal of the third crack detection line is electrically connected with an input terminal of the third detection switch circuit, and an output terminal of the third detection switch circuit is electrically connected with the third data line.

A first terminal of the fourth crack detection line is electrically connected with a fourth node of the third crack detection line, the fourth node is different from the first terminal and second terminal of the third crack detection line, a second terminal of the fourth crack detection line is electrically connected with an input terminal of the fourth detection switch circuit, and an output terminal of the fourth detection switch circuit is electrically connected with the fourth data line.

A control terminal of the third detection switch circuit and a control terminal of the fourth detection switch circuit are electrically connected with a fourth test terminal.

The first crack detection line and the second crack detection line are located at one side of a central axis of the display panel, and the third crack detection line and the fourth crack detection line are located at the other side of the central axis of the display panel, wherein the central axis is a central axis between the third region and the fourth region.

In an exemplary embodiment, the first terminal and second terminal of the third crack detection line are located in the first region; the third crack detection line is located in the first region, the second region, and the fourth region; and the first terminal of the fourth crack detection line is located in the second region, while the second terminal is located in the first region, and the fourth crack detection line is located in the first region, the second region, and the fourth region.

In an exemplary embodiment, the display panel further includes a first sub-pixel connected with the first data line and a second sub-pixel connected with the second data line, wherein a color of the first sub-pixel is different from that of the second sub-pixel.

In an exemplary embodiment, on a plane parallel to the display surface of the display panel, an orthogonal projection of the third crack detection line includes an orthogonal projection of the fourth crack detection line.

In an exemplary embodiment, the third crack detection line is arranged in the same layer as the first crack detection line, and the fourth crack detection line is arranged in the same layer as the second crack detection line.

In an exemplary embodiment, on the plane perpendicular to the display surface of the display panel, the display panel includes a display substrate and touch structure layer that are sequentially arranged, wherein one of the first crack detection line and the second crack detection line is arranged in a peripheral region of the display substrate, while the other is arranged in a peripheral region of the touch structure layer.

In an exemplary embodiment, the first crack detection line is arranged in the peripheral region of the touch structure layer, and the second crack detection line is arranged in the peripheral region of the display substrate.

In an exemplary embodiment, the display substrate includes a driving structure layer, the driving structure layer includes an active layer, a first gate insulator, a first gate metal layer, a second gate insulator, a second gate metal layer, an interlayer insulating layer, and a source and drain metal layer, and the second crack detection line is arranged in the same layer as the source and drain metal layer; or, the display substrate includes a driving structure layer, the driving structure layer includes an active layer, a first gate insulator, a first gate metal layer, a second gate insulator, a second gate metal layer, an interlayer insulating layer, and a source and drain metal layer, and the second crack detection line is arranged in the same layer as the second gate metal layer.

In an exemplary embodiment, the touch structure layer includes a transfer metal layer, touch insulating layer and touch electrode layer that are sequentially arranged, the first crack detection line is arranged in the same layer as the touch electrode layer, or, the first crack detection line is arranged in the same layer as the transfer metal layer.

In another aspect, an embodiment of the present disclosure provides a display device, including the display panel as described in the above-mentioned embodiment.

In another aspect, an embodiment of the present disclosure provides a crack detection method for a display panel, wherein the display panel is the display panel as described in any one of the above-mentioned embodiments, and the display panel further includes sub-pixels connected with the data lines, and the crack detection method includes: receiving a turn-on signal input from the second test terminal to turn on the first detection switch circuit and the second detection switch circuit, and receiving a test signal input from the first test terminal, wherein the test signal satisfies that a sub-pixel connected with a data line is in a first light emitting state when the test signal is loaded to the data line; and determining crack state information of the display panel according to the light emitting state of the sub-pixel of the display panel.

In an exemplary embodiment, the determining crack state information of the display panel according to the light emitting state of the sub-pixel of the display panel includes: there being a crack between the first terminal and third node of the first crack detection line when a sub-pixel connected with the first data line is in a second light emitting state and a sub-pixel connected with the second data line is in the second light emitting state; there being no crack between the first terminal and third node of the first crack detection line, a crack between the third node and the second terminal of the first crack detection line, and no crack between the first terminal and second terminal of the second crack detection line when the sub-pixel connected with the first data line is in the second light emitting state and the sub-pixel connected with the second data line is in the first light emitting state; and there being a crack between the first terminal and second terminal of the second crack detection line and no crack between the first terminal and second terminal of the first crack detection line when the sub-pixel connected with the first data line is in the first light emitting state and the sub-pixel connected with the second data line is in the second light emitting state; wherein one of the first light emitting state and the second light emitting state is an on state, and the other of the first light emitting state and the second light emitting state is an off state.

Other characteristics and advantages of the present disclosure will be elaborated in the following specification and, moreover, partially become apparent from the specification or are understood by implementing the present disclosure. The objectives and advantages of the present disclosure may be achieved through structures particularly pointed out in the specification and the drawings.

Other aspects will become apparent upon reading and understanding the drawings and the detailed description.

BRIEF DESCRIPTION OF DRAWINGS

The drawings are used to provide further understanding of the technical solutions of the present disclosure, constitute a part of the specification, and together with the embodiments of the present disclosure, are used to explain the technical solutions but not to form limitations to the technical solutions of the present disclosure.

DETAILED DESCRIPTION

Figure 1:
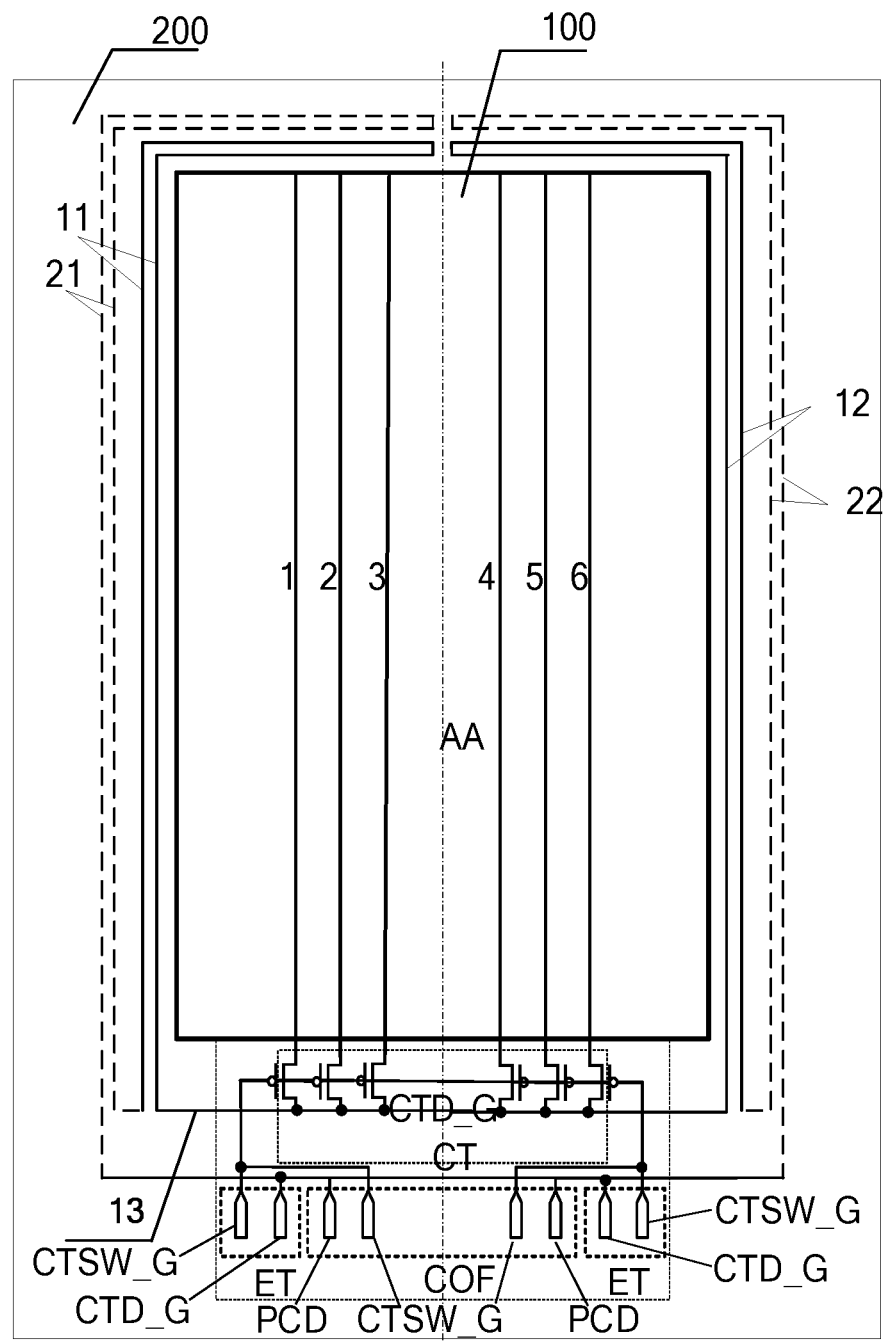
FIG. 1 is a schematic diagram of a display panel according to a technical solution.

The embodiments of the present disclosure will be described in detail below in combination with the drawings.

The embodiments in the present disclosure and the features in the embodiments may be freely combined if there is no conflict.

The acts shown in the flowchart of the drawing may be executed, e.g., in a computer system with a set of computer-executable instructions. Moreover, although a logic sequence is shown in the flowchart, the shown or described acts may be executed in a sequence different from that shown herein in some circumstances.

Unless otherwise defined, technical terms or scientific terms used in the present disclosure should have the meanings as commonly understood by those of ordinary skill in the art that the present disclosure belongs to "First", "second", and similar terms used in the present disclosure do not represent any sequence, number, or significance, but are only used to distinguish different components. "Include", "contain", or a similar term means that an element or object appearing before the term covers an element or object and equivalent thereof listed after the term and does not exclude other elements or objects. "Connect", "couple", or a similar term is not limited to physical or mechanical connection but may include electrical connection, either direct or indirect. "Upper", "lower", "left", "right", etc., are only used to represent relative positional relationships, and when an absolute position of a described object is changed, the relative positional relationship may also be correspondingly changed.

In the present specification, the transistor refers to an element that at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current may flow through the drain electrode, the channel region, and the source region. In the present specification, the channel region refers to a region that the current mainly flows through.

In the present specification, a first electrode may be a drain electrode, and a second electrode may be a source electrode. Alternatively, a first electrode may be a source electrode, and a second electrode may be a drain electrode. In a case that transistors with opposite polarities are used, or a current direction changes during the work of a circuit, or the like, functions of the "source electrode" and the "drain electrode" may sometimes be exchanged. Therefore, the "source electrode" and the "drain electrode" may be exchanged in the present specification.

In the present specification, "an orthogonal projection of A includes an orthogonal projection of B" refers to that the orthogonal projection of B is within a range of the orthogonal projection of A or the orthogonal projection of A covers the orthogonal projection of B.

In the present specification, "parallel" refers to a state that an angle formed by two straight lines is above −10° and below 10°, and thus may include a state that the angle is above −5° and below 5°. In addition, "perpendicular" refers to a state that an angle formed by two straight lines is above 80° and below 100°, and thus may include a state that the angle is above 85° and below 95°.

FIG. 1 is a schematic diagram of a planar structure of a display panel. The display panel is a display panel using an FMLOC technology. The display panel may include a display substrate and a touch structure layer located on the display substrate. The display substrate may include a base substrate, a driving structure layer, a light emitting structure layer and an encapsulation layer, which are sequentially arranged. The touch structure layer is located at a side of the encapsulation layer away from the base substrate. The driving structure layer may include an active layer, a first gate insulator, a first gate electrode layer, a second gate insulator, a second gate electrode layer, an interlayer insulating layer and a source and drain layer, which are sequentially arranged. The touch structure layer may include a transfer metal layer, a touch insulating layer and a touch electrode layer, which are sequentially arranged. As shown in FIG. 1, the display panel includes a display region 100 and a peripheral region 200 located at a periphery of the display region 100, and the peripheral region 200 surrounds the display region 100. The display region 100 is also referred to as an Active Area (AA). The display panel may further include a first crack detection line, and the first crack detection line is located in the peripheral region 200 and arranged around the display region 100. The first crack detection line may include a first lead section 11, a second lead section 12, and a fifth lead section 13. The first crack detection line may be arranged in the same layer as the source and drain layer or the second gate electrode layer. The display panel may further include a second crack detection line, and the second crack detection line is located in the peripheral region 200 and arranged around the display region 100. The second crack detection line may include a third lead section 21 and a fourth lead section 22. The second crack detection line may be arranged in the same layer as the touch electrode layer. The first lead section 11 is electrically connected to the third lead section 21 through a via, and the second lead section 12 is electrically connected to the fourth lead section 22 through a via.

In the embodiment, in an Electrical Test (ET) stage, a test signal starts from an Electrical Test (ET) unit or a Chip On Film (COF) unit, enters a Cell Test (CT) unit of the panel along peripheral wirings of the display panel (from the third lead section 21 to the first lead section 11, from the fourth lead section 22 to the second lead section 12), and is connected to a data line of the display region 100 through a plurality of Thin Film Transistors (TFTs) in the CT unit, wherein gates of the TFTs of the CT unit are controlled by CTSW signals. During the ET (Electrical Test), it is determined that the display panel has a crack when a bright line is formed in the display region 100. Since the first lead section 11 and the third lead section 21 are connected in series into a whole, and the second lead section 12 and the third lead section 22 are connected in series into a whole, although that a crack is formed in a left side or right side of the display panel may be determined, it is impossible to determine the crack is formed in the display substrate or the touch structure layer.

In a module test stage, a test signal is input from a Panel Crack Detection (PCD) pad at one side, an output signal of the PCD pad at the other side is detected, and whether there is a crack is determined according to the output signal. In such case, the test signal sequentially passes through the third lead section 21, the first lead section 11, the fifth lead section 13, the second lead section 12 and the fourth lead section 22 from the PCD pad at one side, and reaches the PCD pad at the other side to obtain the output signal, and whether a crack is formed in the display panel may be determined according to a state of the output signal. When it is determined that a crack is formed in the peripheral region 200 of the display panel, it is impossible to determine that the crack is formed at a position (the display substrate) where the first crack detection line is located or a position (the touch structure layer) where the second crack detection line is located since the second crack detection line is connected in series with the first crack detection line to form a whole circuit. When the display panel shown in FIG. 1 is used, since crack detection wirings of the touch structure layer and display substrate at the periphery of the panel are connected together in series, so it is impossible to detect a position of a crack, which makes it quite inconvenient to improve and repair the panel.

Figure 2:
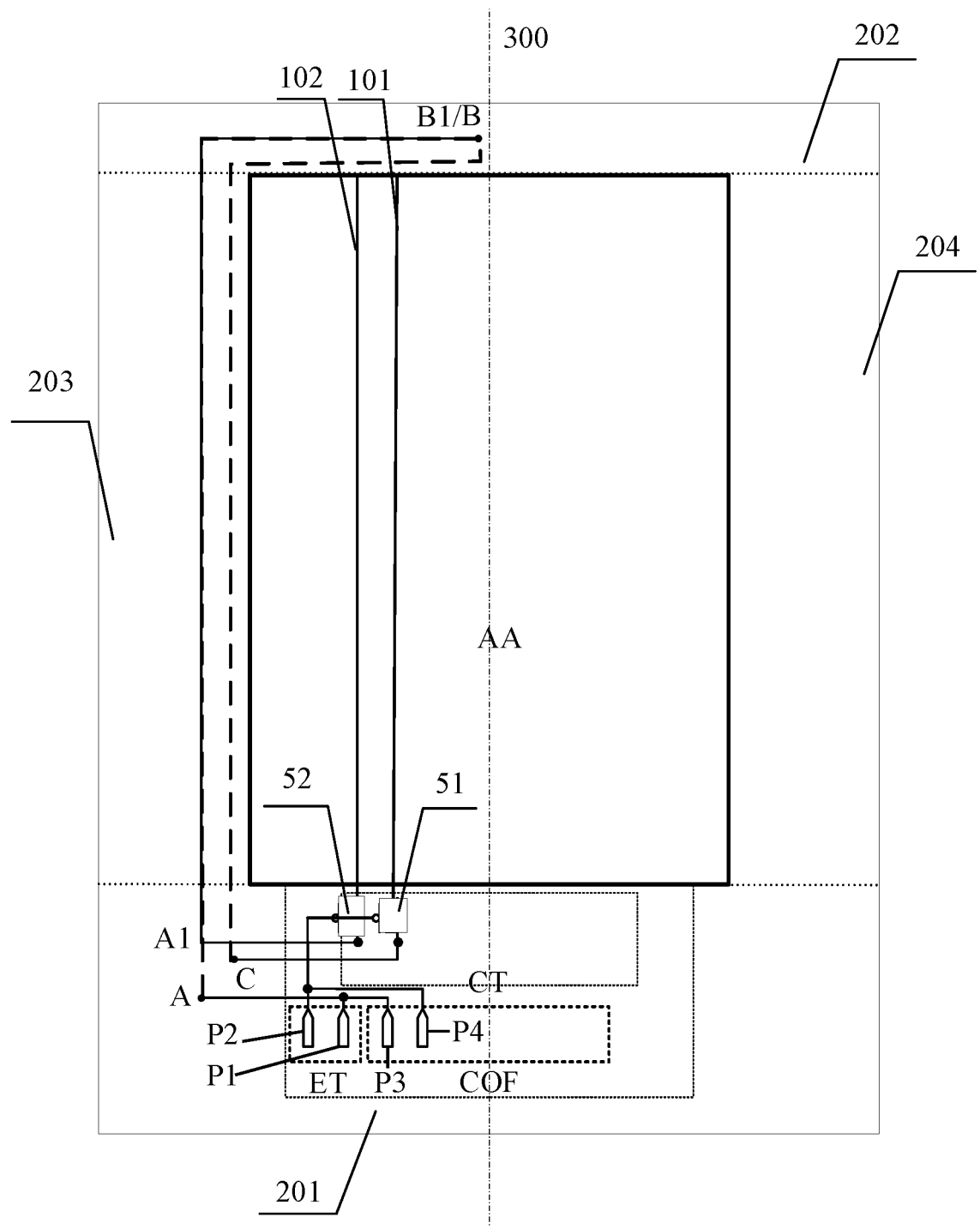
FIG. 2 is a schematic diagram of a display panel according to an embodiment of the present disclosure.

FIG. 2 is a schematic diagram of a planar structure of a display panel according to an embodiment of the present disclosure. As shown in FIG. 2, an embodiment of the present disclosure provides a display panel, including a display region 100 and a peripheral region 200 surrounding the display region 100. At least one first data line 101 and at least one second data line 102 are arranged in the display region 100, a crack detection circuit structure is arranged in the peripheral region 200, and the crack detection circuit structure includes a first crack detection line, a second crack detection line, a first detection switch circuit 51 electrically connected with the first data line 101, and a second detection switch circuit 52 electrically connected with the second data line 102. The display panel includes multiple function layers sequentially arranged on a plane perpendicular to a display surface of the display panel, and the first crack detection line and the second crack detection line are arranged in different function layers.

A first terminal A of the first crack detection line is configured to be electrically connected with a first test terminal, a second terminal C of the first crack detection line is electrically connected with an input terminal of the first detection switch circuit 51, and an output terminal of the first detection switch circuit 51 is electrically connected with the first data line 101; the first terminal A of the first crack detection line is a head terminal of the first crack detection line, while the second terminal C is a tail terminal of the first crack detection line.

A first terminal B1 of the second crack detection line is electrically connected with a third node B of the first crack detection line (connected through a via), the third node B is different from the first terminal A and second terminal C of the first crack detection line, a second terminal A1 of the second crack detection line is electrically connected with an input terminal of the second detection switch circuit 52 and an output terminal of the second detection switch circuit 52 is electrically connected with the second data line 102. The first terminal B1 of the second crack detection line is a head terminal of the second crack detection line, while the second terminal A1 is a tail terminal of the second crack detection line; the third node B is a middle node of the first crack detection line.

A control terminal of the first detection switch circuit 51 and a control terminal of the second detection switch circuit 52 are configured to be electrically connected with a second test terminal.

According to the display substrate provided in the embodiment, the first crack detection line and the second crack detection line are arranged in different function layers, and after a test signal is applied to the first test terminal, a position of a crack may be determined according to a light emitting state of a sub-pixel connected with the first data line and a light emitting state of a sub-pixel connected with the second data line. Thereby, the independent detection of cracks at a position of the first crack detection line and a position of the second crack detection line is implemented. Therefore, a position where a crack is formed can be detected, which contributes to positioning the crack in processes of producing a product and analyzing a related defect, achieving high detection efficiency and improving the yield, the productivity and the performance of the product.

The node position shown in FIG. 2 is merely an example, and the embodiments of the present disclosure are not limited thereto.

In an exemplary embodiment, the first data line 101 may be in one-to-one correspondence with the first detection switch circuit 51; the output terminal of the first detection switch circuit 51 is electrically connected with the corresponding first data line 101; the second data line 102 may be in one-to-one correspondence with the second detection switch circuit 52; and the output terminal of the second detection switch circuit 52 is electrically connected with the corresponding second data line 102.

FIG. 2 only shows one first data line 101, one detection switch circuit 51 corresponding to the first data line 101, one second data line 102 and one detection switch circuit 52 corresponding to the second data line 102. However, the embodiments of the present disclosure are not limited thereto, and there may be multiple first data lines 101 and multiple corresponding detection switch circuits 51, as well as multiple second data lines 102 and multiple corresponding detection switch circuits 52. Each data line is connected with a column of sub-pixels to control light emitting states of the sub-pixels.

In an exemplary embodiment, as shown in FIG. 2, the peripheral region 200 includes a first region 201 with a bonding region (configured to bond a driver integrate circuit), a second region 202 arranged opposite to the first region 201, and a third region 203 and fourth region 204 that are connected with the first region 201 and the second region 202 and arranged opposite to each other.

The first terminal A and second terminal C of the first crack detection line may be located in the first region; the first crack detection line may be located in the first region 201, the second region 202, and the third region 203.

The first terminal B1 of the second crack detection line may be located in the second region 202, while the second terminal A1 may be located in the first region 201, and the second crack detection line may be located in the first region 201, the second region 202, and the third region 203.

In an exemplary embodiment, the first crack detection line and the second crack detection line may be located at a side of a central axis 300 of the display panel close to the third region 203. The central axis 300 is located between the third region 203 and the fourth region 204. The terminals B1 and B are as close as possible to the central axis 300, so that a crack detection range is as large as possible. The embodiments of the present disclosure are not limited thereto, and the first crack detection line and the second crack detection line may be distributed in any region(s) of the peripheral region 200.

In an exemplary embodiment, on a plane parallel to the display surface of the display panel, an orthogonal projection of the first crack detection line may include that of the second crack detection line. As shown in FIG. 2, an orthogonal projection of the first terminal B1 of the second crack detection line may coincide or approximately coincide with that of the third node B of the first crack detection line, an orthogonal projection of the second terminal A1 of the second crack detection line is within that of the first crack detection line, and an extension direction from the terminal B1 to A1 is the same as that from B to A. In the embodiment, when a line width of the second crack detection line is larger than that of the first crack detection line, as long as the orthogonal projection of the terminal A1 is within that of the first crack detection line and the extension direction from the terminal B1 to A1 is the same as that from B to A, it is also considered that an orthogonal projection of the second crack detection line is within that of the first crack detection line. That is, line widths of the first crack detection line and the second crack detection line may be different, but when the orthogonal projections of the terminals thereof coincide, and the extension directions are the same, it is considered that the orthogonal projection of the first crack detection line includes that of the second crack detection line. Compared with the solution shown in FIG. 1, this solution reduces an area occupied by crack detection wirings, thereby capable of reducing a bezel.

In another embodiment, the orthogonal projection of the second crack detection line may be located outside that of the first crack detection line. For example, it may be located at a side of the first crack detection line away from the display region 100, or a side of the first crack detection line close to the display region 100.

Figure 3:
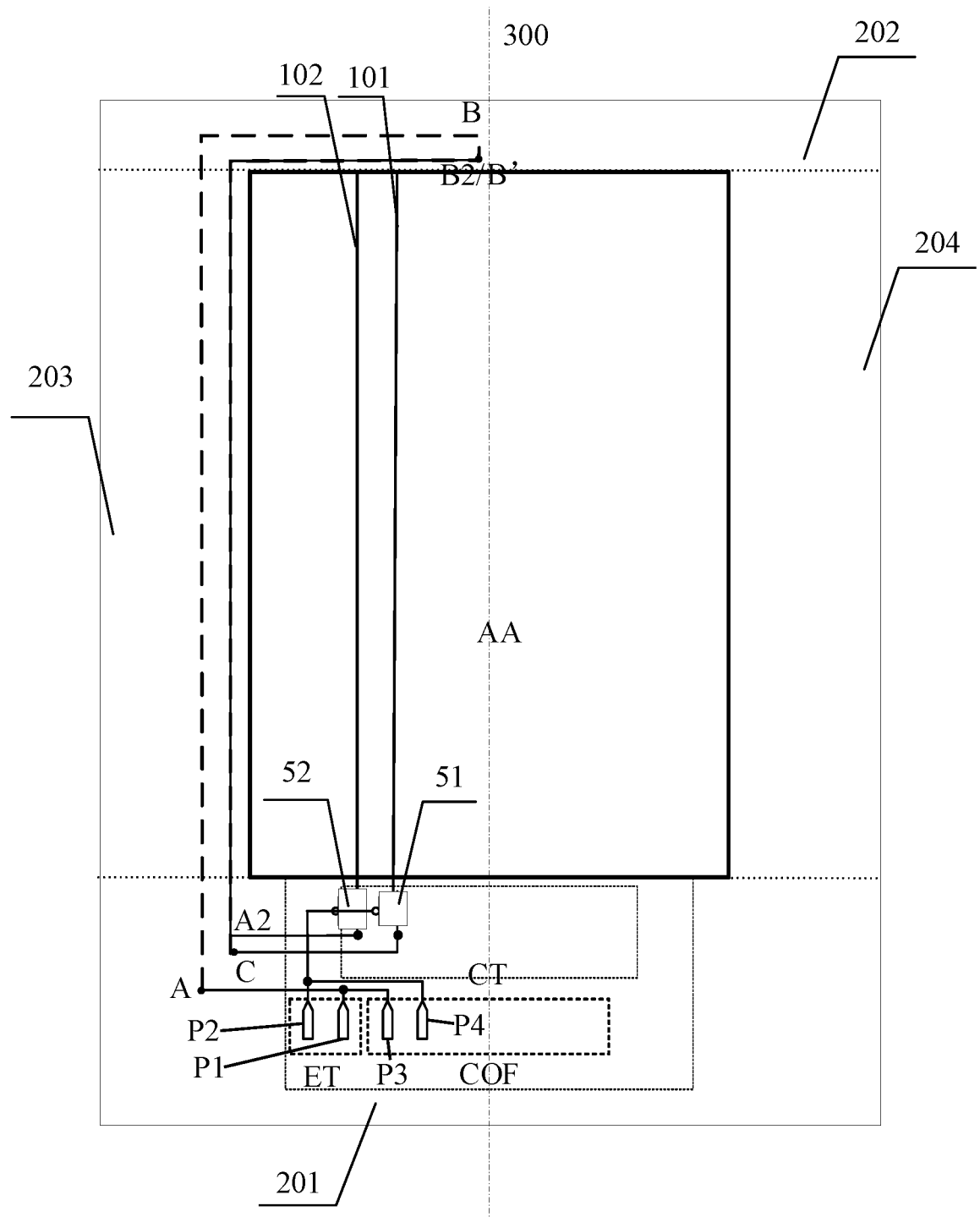
FIG. 3 is a schematic diagram of a display panel according to an embodiment.

In the solution shown in FIG. 2, the first crack detection line includes a lead section from A to B and a lead section from B to C, and the second crack detection line includes a lead section from B1 to A1, wherein the lead section from B to C may be located at a side of the lead section from A to B close to the display region 100, and an orthogonal projection of the lead section from A to B may cover that of the terminal A1. However, the embodiments of the present disclosure are not limited thereto. As shown in FIG. 3, the first crack detection line may include a lead section from A to B, a lead section from B to B', and a lead section from B' to C. The lead section from B to C may be located at a side of the lead section from A to B close to the display region 100. The second crack detection line includes a lead section from the terminal B2 to A2, wherein the terminal A, the terminal C and the terminal A2 may be located in the first region 201, the terminal B, the terminal B' and the terminal B2 may be located in the second region 202, an orthogonal projection of the terminal B2 may coincide with that of the terminal B', and an orthogonal projection of the lead section from the terminal B to the terminal C may include that of the terminal A2. The terminal A2 is electrically connected to the input terminal of the second detection switch circuit 52.

Figure 4:
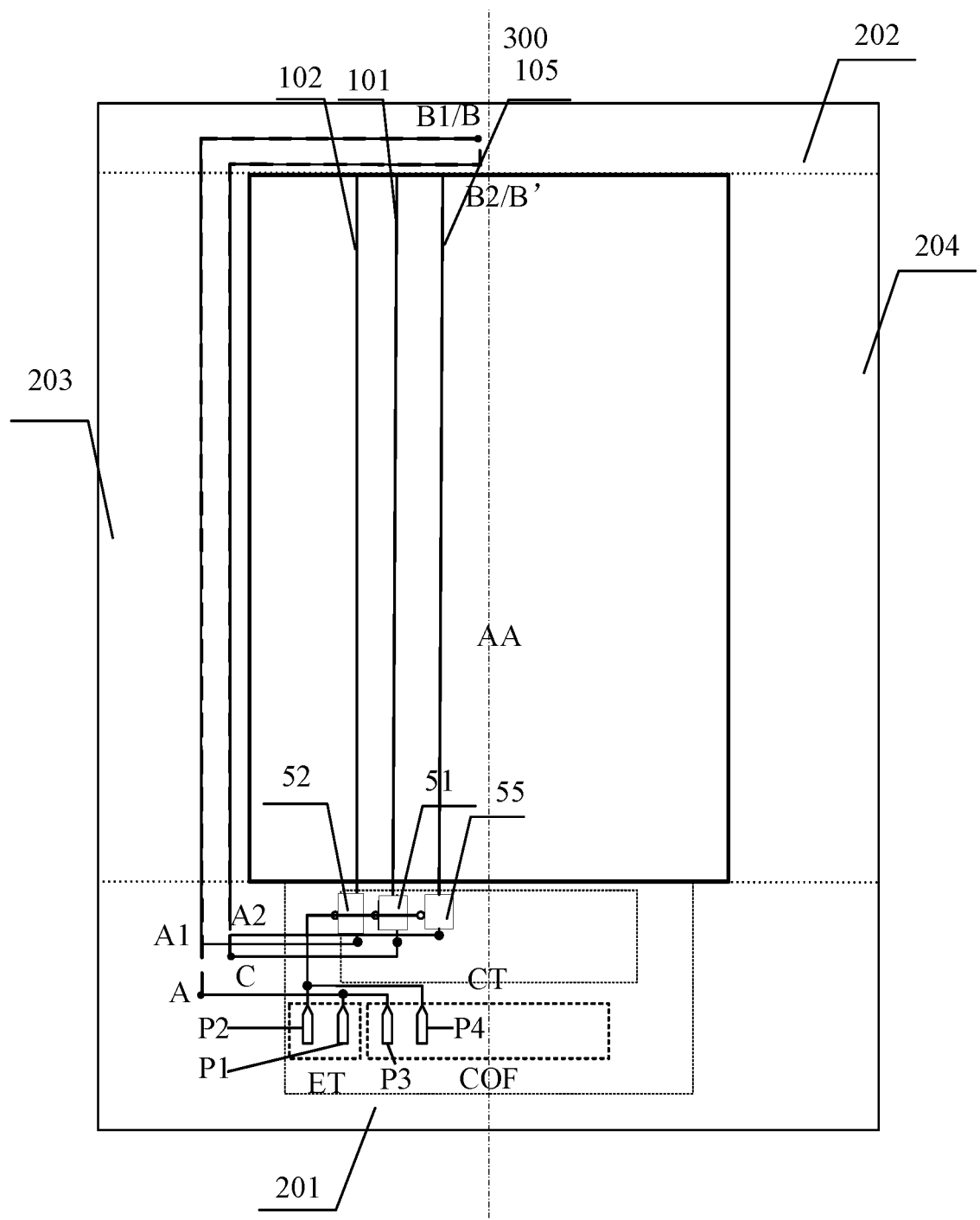
FIG. 4 is a schematic diagram of a display panel according to another embodiment.

In another embodiment, as shown in FIG. 4, the display region 100 may further include a fifth data line 105, and the crack detection circuit structure may include a first crack detection line, a second crack detection line, a fifth crack detection line, a first detection switch circuit 51, a second detection switch circuit 52, and a fifth detection switch circuit 55. The first crack detection line may include a lead section from an terminal A to an terminal B, a lead section from the terminal B to an terminal B', and a lead section from the terminal B' to an terminal C, the second crack detection line may include a lead section from an terminal B1 to an terminal A1, and the fifth crack detection line may include a lead section from an terminal B2 to an terminal A2. The terminal B1 is electrically connected to the terminal B through a via, the terminal B2 is electrically connected to the terminal B' through a via, the terminal C of the first crack detection line is electrically connected to an input terminal of the first detection switch circuit 51, an output terminal of the first detection switch circuit 51 is electrically connected to the first data line 101, the terminal A1 of the second crack detection line is electrically connected to an input terminal of the second detection switch circuit 52, an output terminal of the second detection switch circuit 52 is electrically connected to the second data line 102, the terminal A2 of the fifth crack detection line is electrically connected to an input terminal of the fifth detection switch circuit 55, and an output terminal of the fifth detection switch circuit 55 is electrically connected to the fifth data line 105.

In an exemplary embodiment, each of the first crack detection line and the second crack detection line may include a serpentine structure (e.g., an S-shaped, W-shaped or Z-shaped wiring).

Figure 5:
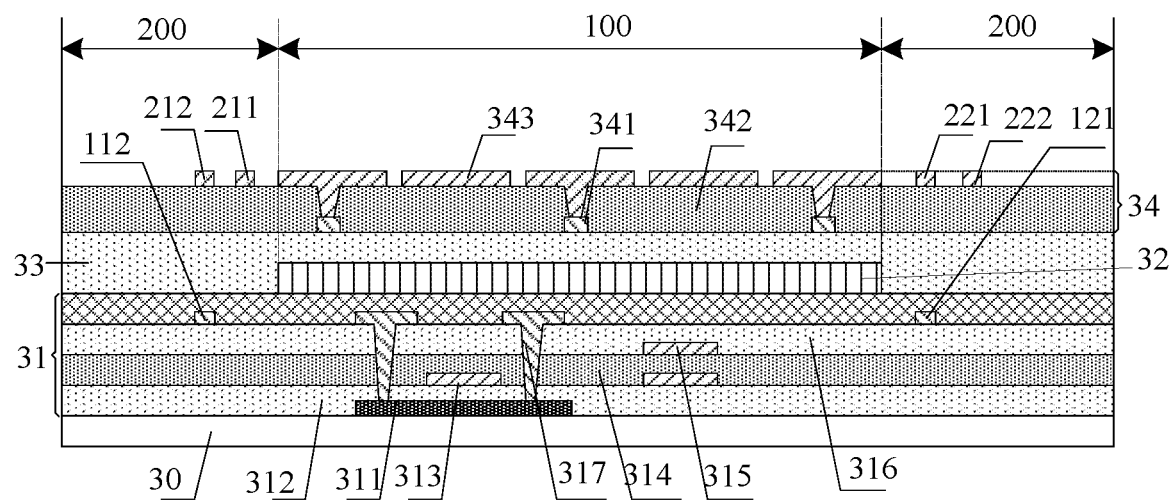
FIG. 5 is a schematic sectional view of a display panel according to another embodiment.

In an exemplary embodiment, as shown in FIG. 5, on the plane perpendicular to the display surface of the display panel, the display panel may include a display substrate and touch structure layer 34 that are sequentially arranged, wherein the display substrate may include a base substrate 30, a driving structure layer 31, a light emitting structure layer 32 and an encapsulation layer 33, which are sequentially arranged, and the touch structure layer 34 may include a transfer metal layer 341, a touch insulating layer 342 and a touch electrode layer 343, which are sequentially arranged. One of the first crack detection line and the second crack detection line may be arranged in a peripheral region of the display substrate, while the other may be arranged in a peripheral region of the touch structure layer 34. For example, the first crack detection line is arranged in the peripheral region of the touch structure layer 34, and the second crack detection line may be arranged in the peripheral region of the display substrate; or, the second crack detection line may be arranged in the peripheral region of the touch structure layer 34, and the first crack detection line may be arranged in the peripheral region of the display substrate. The embodiment of the present disclosures are not limited thereto, and the first crack detection line and the second crack detection line may be arranged in corresponding function layers when the display panel includes more function layers and whether there are cracks in the function layers needs to be located. In addition, the embodiments of the present disclosure are not limited to the arrangement of the first crack detection line and the second crack detection line, and more crack detection lines may be arranged to detect corresponding function layers.

In an exemplary embodiment, the first test terminal may include an ET pad P1, and the second test terminal may include an ET pad P2, or, the first test terminal may include a module test pad P3, and the second test terminal may include a module test pad P4, or, the first test terminal may include an ET pad P1 and a module test pad P3, and the second test terminal may include an ET pad P2 and a module test pad P4. The ET pad P1 and the ET pad P2 may be electrically connected with a detection probe, the ET pad P1 provides a test signal to the first crack detection line (to transmit from the first crack detection line to the second crack detection line), and the ET pad P2 provides a control signal to the first detection switch circuit 51 and the second detection switch circuit 52 to turn on the detection switch circuits. The module test pad P3 and the module test pad P4 may be electrically connected with a driver integrate circuit, the module test pad P3 provides a test signal to the first crack detection line (to transmit from the first crack detection line to the second crack detection line), and the module test pad P4 provides a control signal to the first detection switch circuit 51 and the second detection switch circuit 52 to turn on the detection switch circuits.

In an exemplary embodiment, the first crack detection line may be arranged in the peripheral region of the touch structure layer 34, the second crack detection line may be arranged in the peripheral region of the display substrate, and when the crack detection lines are shown in FIG. 2, a crack detection process may include the following.

When PCD is performed in an ET stage, a control signal is loaded to the first detection switch circuit 51 and the second detection switch circuit 52 through the second test terminal, i.e., the ET pad P2, so as to turn on the first detection switch circuit 51 and the second detection switch circuit 52, and a test signal is loaded to the terminal A of the first crack detection line through the first test terminal, i.e., the ET pad P1. When there is no crack, the test signal is loaded to the first data line 101 connected with the first detection switch circuit 51 through the first crack detection line such that a sub-pixel connected with the first data line 101 is in a first light emitting state, and the test signal reaches the terminal B through the terminal A, reaches the terminal B1 of the second crack detection line from the terminal B, and is loaded to the second data line 102 connected with the second detection switch circuit 52 through the second crack detection line such that a sub-pixel connected with the second data line 102 is in the first light emitting state; and a sub-pixel connected with a data line not for crack detection in the display panel is in the first light emitting state.

When there is a crack between the terminal A and terminal B of the touch structure layer 34, and an open circuit is formed at the terminal A, the test signal cannot be transmitted to the terminal B and the terminal C, and also cannot be transmitted to the terminal B1 and the terminal A1, so that the first data line 101 connected with the first crack detection line is in a suspended state, the sub-pixel connected with the first data line 101 is in a second light emitting state, the second data line 102 connected with the second crack detection line is in a suspended state, and the sub-pixel connected with the second data line 102 is in the second light emitting state.

When there is no crack between the terminal A and terminal B of the touch structure layer 34 and a crack between the terminal B and the terminal C, the test signal cannot be transmitted to the terminal C such that the first data line 101 connected with the terminal C is in a suspended state, and the sub-pixel connected with the first data line 101 is in the second light emitting state, but the test signal can be transmitted to the terminal B through the terminal A, to the terminal B1 through the terminal B and then to the terminal A1 such that the sub-pixel connected with the second data line 102 connected with the terminal A1 is in the first light emitting state.

When there is a crack between the terminal B1 and terminal A1 of the display substrate and no crack between the terminal A and terminal C of the touch structure layer 34, the test signal is transmitted to the terminal C through the terminal A, and to the first data line 101 connected with the terminal C through the terminal C, so that the sub-pixel connected with the first data line 101 is in the first light emitting state; the test signal cannot be transmitted to the terminal A1, so that the second data line 102 connected with the terminal A1 is in a suspended state, and the sub-pixel connected with the second data line 102 is in the second light emitting state.

That is, there is a crack between the terminal A and terminal B of the touch structure layer 34 when the sub-pixel connected with the first data line 101 is in the second light emitting state and the sub-pixel connected with the second data line 102 is in the second light emitting state; it is determined that there is no crack between the terminal A and terminal B of the touch structure layer 34, a crack between the terminal B and the terminal C and no crack between the terminal B1 and terminal A1 of the display substrate when the sub-pixel connected with the first data line 101 is in the second light emitting state and the sub-pixel connected with the second data line 102 is in the first light emitting state; and it is determined that there is a crack between the terminal B1 and terminal A1 of the display substrate and no crack between the terminal A and terminal C of the touch structure layer 34 when the sub-pixel connected with the first data line 101 is in the first light emitting state and the sub-pixel connected with the second data line 102 is in the second light emitting state.

In an exemplary embodiment, the first light emitting state is, for example, an off state, and the second light emitting state is, for example, an on state; or, the first light emitting state is, for example, an on state, and the second light emitting state is, for example, an off state.

The first light emitting state being an off state and the second light emitting state being an on state is taken as an example. There is a crack between the terminal A and terminal B of the touch structure layer 34 when the sub-pixel connected with the first data line 101 is in the on state (sub-pixels in a column are in the on state, so that a bright line is formed on the display panel) and the sub-pixel connected with the second data line 102 is in the on state (a bright line is formed on the display panel). It is determined that there is no crack between the terminal A and terminal B of the touch structure layer 34, a crack between the terminal B and the terminal C and no crack between the terminal B1 and terminal A1 of the display substrate when the sub-pixel connected with the first data line 101 is in the on state (a bright line is formed on the display panel) and the sub-pixel connected with the second data line 102 is in the off state. It is determined that there is a crack between the terminal B1 and terminal A1 of the display substrate and no crack between the terminal A and terminal C of the touch structure layer 34 when the sub-pixel connected with the first data line 101 is in the off state and the sub-pixel connected with the second data line 102 is in the on state (a bright line is formed on the display panel).

In an exemplary embodiment, the first data line 101 may be arranged at a side of the second data line 102 close to the third region 203, so that a position where a crack is formed may be directly determined based on the number and positions of bright lines.

In an exemplary embodiment, the first data line 101 and the second data line 102 may be connected with sub-pixels of different colors, and then a position where a crack is formed may be directly determined based on the number and colors of bright lines. The embodiments of the present disclosure are not limited thereto, and a color of light emitted by the sub-pixel connected with the first data line 101 may be the same as that of light emitted by the sub-pixel connected with the second data line 102.

In an exemplary embodiment, the second crack detection line may be arranged in the peripheral region of the touch structure layer 34, the first crack detection line may be arranged in the peripheral region of the display substrate, and when the crack detection lines are shown in FIG. 2, a crack detection process includes the following.

When PCD is performed in an ET stage, a control signal is loaded to the first detection switch circuit 51 and the second detection switch circuit 52 through the ET pad P2, so as to turn on the first detection switch circuit 51 and the second detection switch circuit 52, and a test signal is loaded to the terminal A of the first crack detection line through the ET pad P1. When there is no crack, the test signal is loaded to the first data line 101 connected with the first detection switch circuit 51 through the first crack detection line such that a sub-pixel connected with the first data line 101 is in a first light emitting state, and the test signal reaches the terminal B through the terminal A, reaches the terminal B1 of the second crack detection line from the terminal B, and is loaded to the second data line 102 connected with the second detection switch circuit 52 through the second crack detection line such that a sub-pixel connected with the second data line 102 is in the first light emitting state; and a sub-pixel connected with a data line not for crack detection in the display panel is in the first light emitting state.

When there is a crack between the terminal A and terminal B of the display substrate, and an open circuit is formed at the terminal A, the test signal cannot be transmitted to the terminal B and the terminal C, and also cannot be transmitted to the terminal B1 and the terminal A1, so that the first data line 101 connected with the first crack detection line is in a suspended state, the sub-pixel connected with the first data line 101 is in a second light emitting state, the second data line 102 connected with the second crack detection line is in a suspended state, and the sub-pixel connected with the second data line 102 is in the second light emitting state.

When there is no crack between the terminal A and terminal B of the display substrate and a crack between the terminal B and the terminal C, the test signal cannot be transmitted to the terminal C such that the first data line 101 connected with the terminal C is in a suspended state, and the sub-pixel connected with the first data line 101 is in the second light emitting state, but the test signal can be transmitted to the terminal B through the terminal A, to the terminal B1 through the terminal B and then to the terminal A1 such that the sub-pixel connected with the second data line 102 connected with the terminal A1 is in the first light emitting state.

When there is a crack between the terminal B1 and terminal A1 of the touch structure layer 34 and no crack between the terminal A and terminal C of the display substrate, the test signal is transmitted to the terminal C through the terminal A, and to the first data line 101 through the terminal C, so that the sub-pixel connected with the first data line 101 is in the first light emitting state; the test signal cannot be transmitted to the terminal A1, so that the second data line 102 connected with the terminal A1 is in a suspended state, and the sub-pixel connected with the second data line 102 is in the second light emitting state.

After a module is prepared, COF is bonded with a driver Integrate Circuit (IC), the driver IC is laminated with the panel, and both a test signal and a control signal are input from the driver IC. Crack detection in a module test stage is similar to that in the ET stage, namely a control signal is loaded to the first detection switch circuit 51 and the second detection switch circuit 52 through the module test pad P4 so as to turn on the first detection switch circuit 51 and the second detection switch circuit 52, a test signal is loaded to the terminal A of the first crack detection line through the module test pad P3, and the others for crack detection are similar to the crack detection in the ET stage, and will not be repeated.

In an exemplary embodiment, the driving structure layer 31 may include an active layer 311, a first gate insulator 312, a first gate metal layer 313, a second gate insulator 314, a second gate metal layer 315, an interlayer insulating layer 316, and a source and drain metal layer 317. The crack detection line arranged on the display substrate may be arranged in the same layer as the source and drain metal layer 317. For example, when the second crack detection line is arranged on the display substrate, the second crack detection line is arranged in the same layer as the source and drain metal layer 317. As shown in FIG. 5, the second crack detection line 112 is arranged in the same layer as the source and drain metal layer 317.

In an exemplary embodiment, the crack detection line arranged on the display substrate may be arranged in the same layer as the second gate metal layer 315. For example, when the second crack detection line is arranged on the display substrate, the second crack detection line is arranged in the same layer as the second gate metal layer 315.

In an exemplary embodiment, a part of the crack detection line arranged on the display substrate may be arranged in the same layer as the source and drain metal layer 317, while another part is arranged in the same layer as the second gate metal layer 315. For example, when the second crack detection line is arranged on the display substrate, a part of the second crack detection line may be arranged in the same layer as the source and drain metal layer 317, while another part is arranged in the same layer as the second gate metal layer 315.

In an exemplary embodiment, the crack detection line arranged on the touch structure layer 34 may be arranged in the same layer as the touch electrode layer 343, or, arranged in the same layer as the transfer metal layer 341. For example, when the first crack detection line is arranged on the touch structure layer 34, the first crack detection line may be arranged in the same layer as the touch electrode layer 343, or, the first crack detection line may be arranged in the same layer as the transfer metal layer 341. As shown in FIG. 5, the first crack detection line is arranged in the same layer as the touch electrode layer 343. The first crack detection line includes two inner and outer lead sections, i.e., 211 (a lead section from the terminal C to the terminal B) and 212 (a lead section from the terminal B to the terminal A), and is arranged in the same layer as the touch electrode layer 343.

Figure 6:
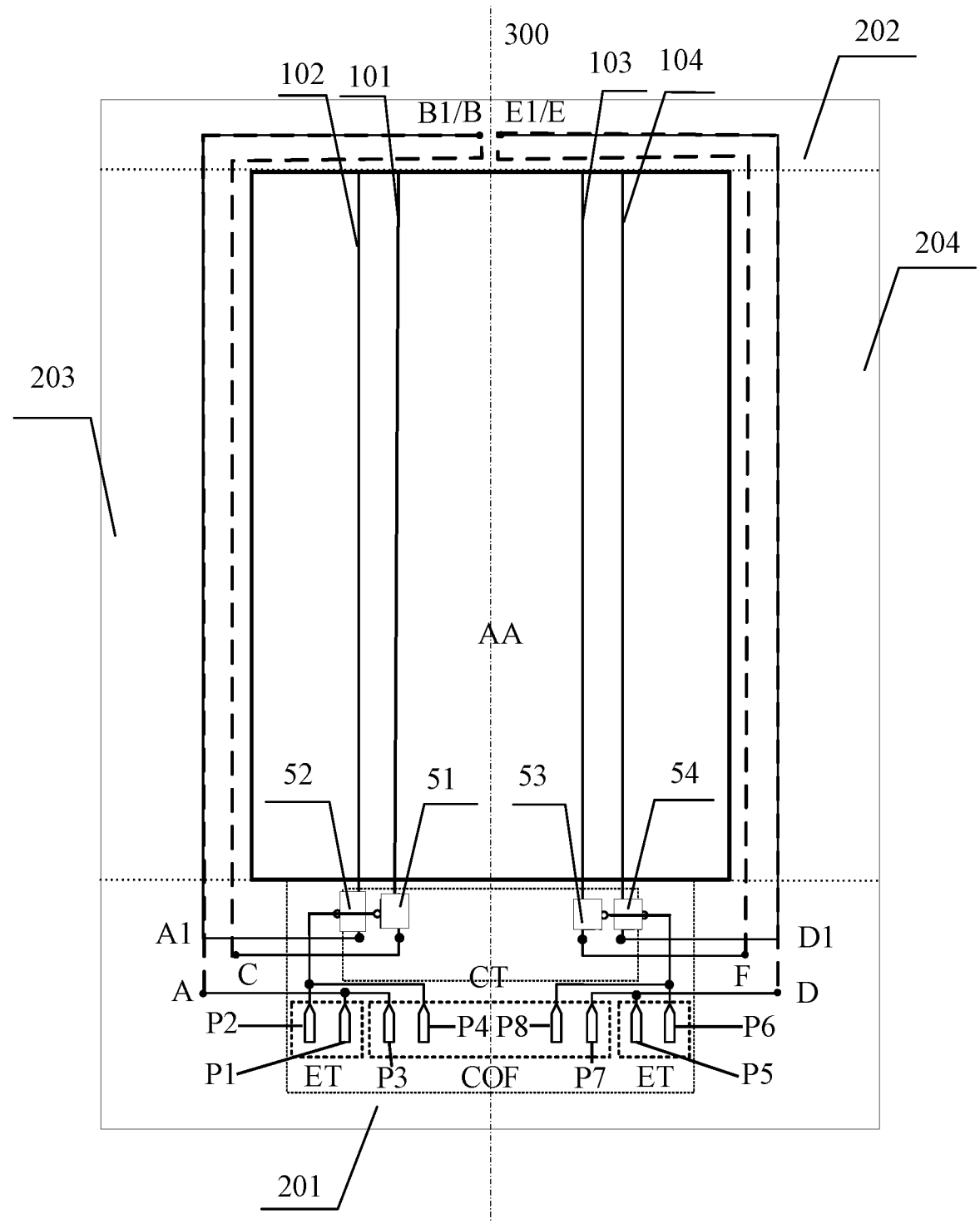
FIG. 6 is a schematic diagram of a display panel according to another embodiment.

FIG. 6 is a schematic diagram of a display panel according to another embodiment. As shown in FIG. 6, a side of the central axis 300 close to the third region 203 is referred to as a first side, and a side close to the fourth region 204 is referred to as a second side. In the display panel provided in the embodiment, crack detection lines are arranged at the two sides of the central axis 300. The crack detection circuit structure may include a first crack detection line, second crack detection line, first detection switch circuit 51 and second detection switch circuit 52 that are arranged at the first side of the central axis 300, and connection relations thereof refer to the above-mentioned embodiments, and will not be repeated herein. The display panel may further include at least one third data line 103 and at least one fourth data line 104, the crack detection circuit structure further includes a third crack detection line and fourth crack detection line that are arranged at the second side of the central axis 300, and may further include a third detection switch circuit 53 electrically connected with the third data line 103 and a fourth detection switch circuit 54 electrically connected with the fourth data line 104, and the third crack detection line and the fourth crack detection line may be arranged in different function layers of the display panel.

A first terminal D of the third crack detection line may be electrically connected with a third test terminal, a second terminal F of the third crack detection line may be electrically connected with an input terminal of the third detection switch circuit 53, and an output terminal of the third detection switch circuit 53 may be electrically connected with the third data line 103.

A first terminal E1 of the fourth crack detection line is electrically connected with a fourth node E of the third crack detection line, a second terminal D1 of the fourth crack detection line is electrically connected with an input terminal of the fourth detection switch circuit 54, and an output terminal of the third detection switch circuit 54 is electrically connected with the fourth data line 104.

A control terminal of the third detection switch circuit 53 and a control terminal of the fourth detection switch circuit 54 are electrically connected with a fourth test terminal.

The first terminal D and second terminal F of the third crack detection line may be located in the first region 201; and the third crack detection line may be located in the first region 201, the second region 202, and the fourth region 204.

The first terminal E1 of the fourth crack detection line may be located in the second region 202, while the second terminal D1 may be located in the first region 201, and the fourth crack detection line may be located in the first region 201, the second region 202, and the fourth region 204.

In the embodiment, the first crack detection line and the third crack detection line do not intersect each other, and the second crack detection line and the fourth crack detection line do not intersect each other. The solution provided in the embodiment may implement the detection of cracks at the two sides of the central axis 300 respectively, namely that the crack is at the left side or right side of the display panel can be determined and which crack detection line located in a layer where the crack is formed can be determined. In the embodiment, the panel is divided into multiple regions corresponding to sub-pixel columns, and a position of a crack is determined based on light emitting states of different sub-pixel columns, so that a tiny crack in the periphery of the panel may be determined directly and accurately, which brings conveniences to repair and improves the yield.

In another embodiment, the first crack detection line, the second crack detection line and the third crack detection line as well as the fourth crack detection line may not be located at the two sides of the central axis 300, there may be a separator line between the third region 203 and the fourth region 204, the first crack detection line and the second crack detection line may be located at one side of the separator line, and the third crack detection line and the fourth crack detection line may be located at the other side of the separator line, etc. In another embodiment, the first crack detection line and the third crack detection line may intersect each other, and the second crack detection line and the fourth crack detection line may intersect each other.

In an exemplary embodiment, when the first crack detection line is arranged in the same layer as the third crack detection line, and the second crack detection line is arranged in the same layer as the fourth crack detection line, the terminal B and the terminal E may be close infinitely but are electrically insulated from each other, and the terminal B1 and the terminal E1 may be close infinitely but are electrically insulated from each other, so that the crack detection lines may cover the peripheral region as much as possible to ensure more comprehensive crack detection.

In an exemplary embodiment, the third test terminal may include an ET pad P5, while the fourth test terminal may include an ET pad P6, or, the third test terminal may include a module test pad P7, while the fourth test terminal may include a module test pad P8, or, the third test terminal may include an ET pad P5 and a module test pad P7, while the fourth test terminal may include an ET pad P6 and a module test pad P8. The ET pad P5 and the ET pad P6 may be electrically connected with a detection probe, the ET pad P5 provides a test signal to the third crack detection line, and the ET pad P6 provides a control signal to the third detection switch circuit 53 and the fourth detection switch circuit 54 to turn on the detection switch circuits. The module test pad P7 and the module test pad P8 may be electrically connected with a driver integrate circuit, the module test pad P7 provides a test signal to the third crack detection line, and the module test pad P8 provides a control signal to the third detection switch circuit 53 and the fourth detection switch circuit 54 to turn on the detection switch circuits.

The implementation of the third crack detection line and the fourth crack detection line is similar to that of the first crack detection line and the second crack detection line, so that the implementation modes of the first crack detection line and the second crack detection line in the above-mentioned multiple embodiments may be applied to the third crack detection line and the fourth crack detection line, and will not be repeated herein, and a crack detection way is also similar to that when the first crack detection line and the second crack detection line are used.

In an exemplary embodiment, each of the third crack detection line and the fourth crack detection line is of, for example, a serpentine structure (e.g., an S-shaped, W-shaped or Z-shaped wiring).

In an exemplary embodiment, the third crack detection line may be arranged symmetrically with the first crack detection line about the central axis 300, and the fourth crack detection line may be arranged symmetrically with the second crack detection line about the central axis 300. However, the embodiments of the present disclosure are not limited thereto, and the crack detection lines at the two sides of the central axis 300 may be asymmetric. The first data line 101 and the second data line 102 may be located at the same side of the central axis 300 as the first crack detection line and the second crack detection line, or, located at a different side of the central axis 300. The third data line 103 and the fourth data line 104 may be located at the same side of the central axis 300 as the third crack detection line and the fourth crack detection line, or, located at a different side of the central axis 300.

In an exemplary embodiment, on a plane parallel to the display surface of the display panel, an orthogonal projection of the third crack detection line may include that of the fourth crack detection line. As shown in FIG. 6, an orthogonal projection of the first terminal E1 of the fourth crack detection line may coincide or approximately coincide with that of the fourth node E of the third crack detection line, an orthogonal projection of the second terminal D1 of the fourth crack detection line is within that of the third crack detection line, and an extension direction from the terminal E1 to D1 is the same as that from E to D. Line widths of the third crack detection line and the fourth crack detection line may be different, but when the orthogonal projections of the terminals thereof coincide or approximately coincide, and the extension directions are the same, it is considered that the orthogonal projection of the third crack detection line includes that of the fourth crack detection line. This solution reduces an area occupied by crack detection wirings, and can reduce a bezel. In another embodiment, an orthogonal projection of the fourth crack detection line may be at least partially located outside that of the third crack detection line.

In an exemplary embodiment, the third crack detection line may be arranged in the same layer as the first crack detection line, and the fourth crack detection line may be arranged in the same layer as the second crack detection line. As shown in FIG. 5, the fourth crack detection line 121 is arranged in the same layer as the second crack detection line 112, and the third crack detection line (two lead sections 221 and 222 of the third crack detection line) is arranged in the same layer as the first crack detection line (two lead sections 211 and 212 of the first crack detection line). The embodiments of the present disclosure are not limited thereto, and in other embodiments, the third crack detection line may be arranged in a different layer from the first crack detection line, while the fourth crack detection line may be arranged in a different layer from the second crack detection line. That is, arrangement ways for the crack detection lines at the two sides of the central axis 300 may be unrelated. For example, the first crack detection line may be arranged on the display substrate, the third crack detection line may be arranged on the touch structure layer, the second crack detection line may be arranged on the touch structure layer, and the fourth crack detection line may be arranged on the display substrate, or there is the like arrangement way.

Figure 7:
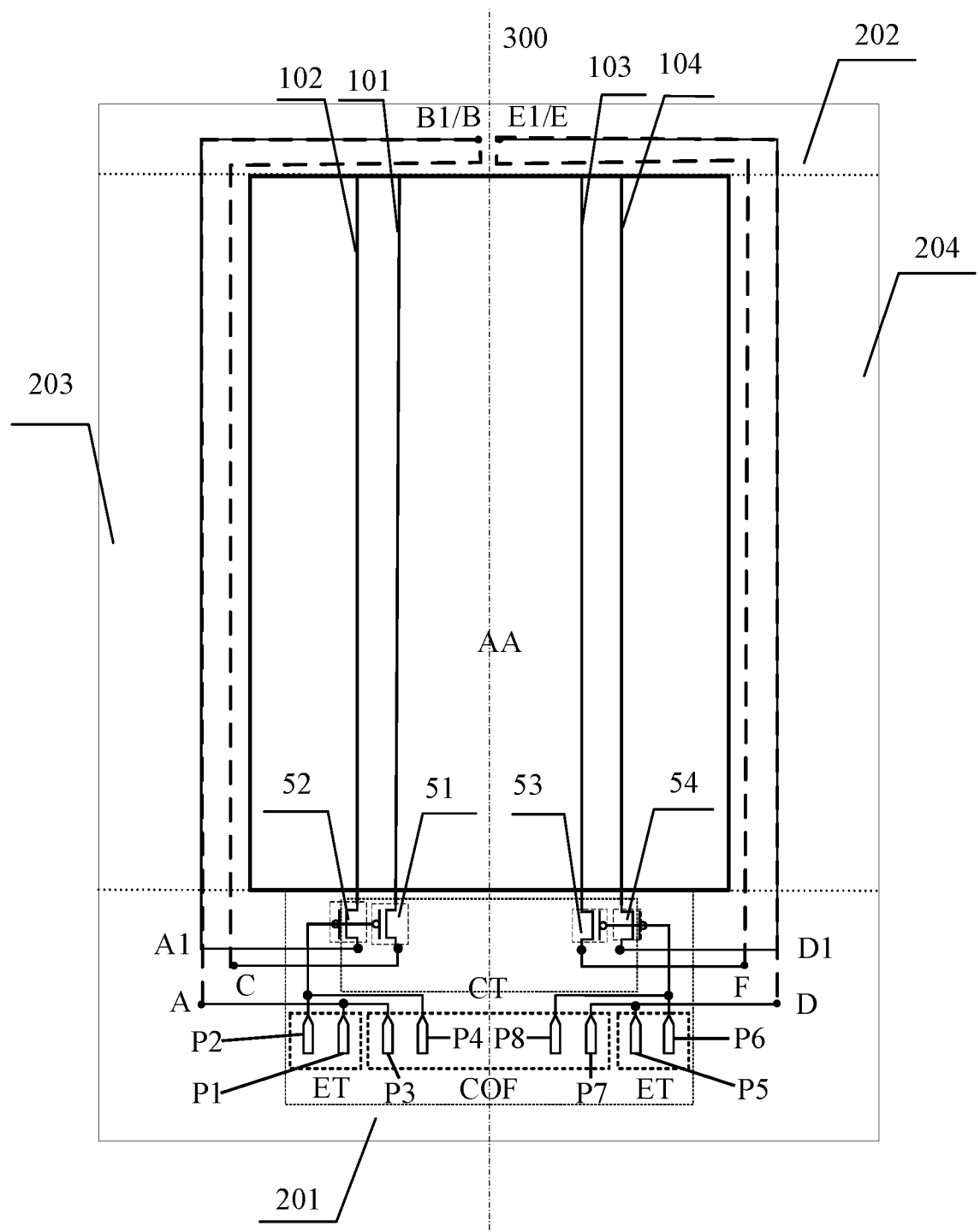
FIG. 7 is a schematic diagram of a display panel according to another embodiment.

In an exemplary embodiment, as shown in FIG. 7, the detection switch circuit (the first detection switch circuit 51 to the fourth detection switch circuit 54) may include at least one thin film transistor, wherein a control electrode of the thin film transistor is the control terminal of the detection switch circuit, a first electrode of the thin film transistor is the input terminal of the detection switch circuit, and a second electrode of the thin film transistor is the output terminal of the detection switch circuit. Taking the thin film transistor being a P-channel Metal Oxide Semiconductor (PMOS) field-effect transistor as an example, in an ET stage, a low level is applied to the second test terminal P2, thereby controlling the first detection switch circuit 51 and the second detection switch circuit 52 to be turned on. The embodiments of the present disclosure are not limited thereto, and in another embodiment, the thin film transistor is, for example, an N-channel Metal Oxide Semiconductor (NMOS) field-effect transistor. In such case, in the ET stage, a high level is applied to the second test terminal P2, thereby controlling the first detection switch circuit 51 and the second detection switch circuit 52 to be turned on. The detection switch circuit provided in the embodiment is merely an example, and may be a switch circuit of another type. For example, the detection switch may include multiple thin film transistors.

Figure 8:
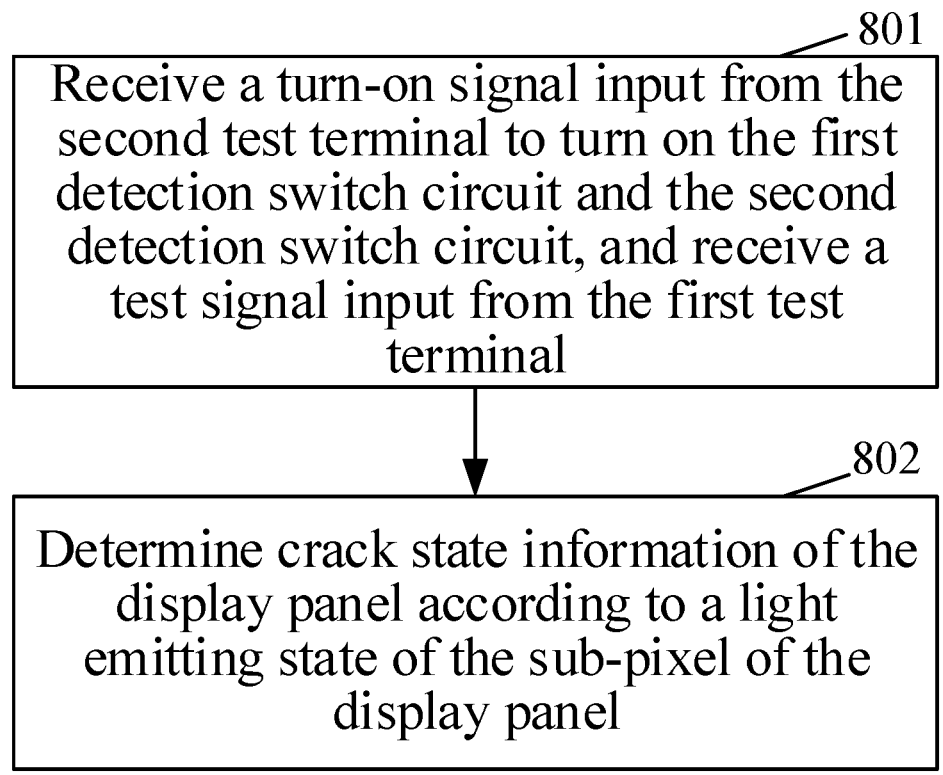
FIG. 8 is a schematic diagram of a crack detection method for a display panel according to an embodiment of the present disclosure.

FIG. 8 is a flowchart of a crack detection method for a display panel according to an embodiment of the present disclosure. As shown in FIG. 8, the embodiment provides a crack detection method for a display panel, wherein the display panel is the display panel as described in the above-mentioned multiple embodiments, and the crack detection method may include the following acts.

In act 801, a turn-on signal input from the second test terminal is received to turn on the first detection switch circuit and the second detection switch circuit, and a test signal input from the first test terminal is received, wherein the test signal satisfies that a sub-pixel connected with a data line is in a first light emitting state when the test signal is loaded to the data line.

In act 802, crack state information of the display panel is determined according to the light emitting state of the sub-pixel of the display panel, and the crack state information may include whether the display panel has a crack, a position of the crack, etc.

In an exemplary embodiment, the act that crack state information of the display panel is determined according to the light emitting state of the sub-pixel of the display panel includes: determining that there is a crack between the first terminal and third node of the first crack detection line when the sub-pixel connected with the first data line is in a second light emitting state and the sub-pixel connected with the second data line is in the second light emitting state; determining that there is no crack between the first terminal and third node of the first crack detection line, a crack between the third node and the second terminal and no crack between the first and second terminal of the second crack detection line when the sub-pixel connected with the first data line is in the second light emitting state and the sub-pixel connected with the second data line is in the first light emitting state; and determining that there is a crack between the first terminal and second terminal of the second crack detection line and no crack between the first terminal and second terminal of the first crack detection line when the sub-pixel connected with the first data line is in the first light emitting state and the sub-pixel connected with the second data line is in the second light emitting state; wherein one of the first light emitting state and the second light emitting state is an on state, while the other is an off state.

In an exemplary embodiment, the display panel has no crack when all sub-pixels of the display panel are in the first light emitting state. For example, the display panel has no crack when the first light emitting state is the off state and all the sub-pixels of the display panel are in the off state (black picture); and when there is a bright line, a region where a crack is formed is determined according to a position or color or both the position and the color of the bright line in the above-mentioned embodiment.

In the crack detection method for a display panel provided in the embodiment of the present disclosure, a function layer where a crack is formed can be determined according to light emitting states of different sub-pixels, thereby improving higher positioning accuracy, facilitating repair, and improving the yield.

Based on the technical concept of the embodiments of the present disclosure, an embodiment of the present disclosure also provides a display device, including the display panel of the above-mentioned embodiments. The display device provided in the embodiment may detect cracks in different function layers to facilitate repair, and improves the yield. The display device may be an Organic Light-Emitting Diode (OLED) display device or another display device. The display device may be any product or component with a display function, such as a smart band, a mobile phone, a tablet computer, a television, a display, a notebook computer, a digital photo frame, and a navigator.

The following points need to be noted:
(1) The drawings of the embodiments of the present disclosure only involve the structures involved in the embodiments of the present disclosure, and the other structures may refer to conventional designs.
(2) For clarity, in the drawings used to describe the embodiments of the present disclosure, a thickness of a layer or a region may be scaled up or scaled down, namely these drawings are not drawn according to a practical scale. It can be understood that, when an element such as a layer, a film, a region or a substrate is referred to as being located "on" or "below" another element, the element may be "directly" located "on" or "below" the other element, or there may be an element between the two elements.
(3) The embodiments in the present disclosure and the features in the embodiments may be combined to obtain new embodiments if there is no conflict.

Although the implementation modes of the present disclosure are disclosed above, the contents described are only implementation modes for easily understanding the present disclosure and not intended to limit the present disclosure. Any person skilled in the art to which the present disclosure pertains may make any modification and variation to the forms and details of the implementations without departing from the spirit and scope disclosed in the present disclosure. However, the patent protection scope of the present disclosure is still subject to the scope defined by the appended claims.

The invention claimed is:

1. A display panel, comprising a display region and a peripheral region surrounding the display region, wherein at least one first data line and at least one second data line are arranged in the display region, a crack detection circuit structure is arranged in the peripheral region, the crack detection circuit structure comprises a first crack detection line, a second crack detection line, a first detection switch circuit electrically connected with the first data line, and a second detection switch circuit electrically connected with the second data line, the display panel comprises multiple function layers sequentially arranged on a plane perpendicular to a display surface of the display panel, and the first crack detection line and the second crack detection line are arranged in different function layers, wherein
a first terminal of the first crack detection line is configured to be electrically connected with a first test terminal, a second terminal of the first crack detection line is electrically connected with an input terminal of the first detection switch circuit, and an output terminal of the first detection switch circuit is electrically connected with the first data line;
a first terminal of the second crack detection line is electrically connected with a third node of the first crack detection line, the third node is different from the first terminal and the second terminal of the first crack detection line, a second terminal of the second crack detection line is electrically connected with an input terminal of the second detection switch circuit, and an output terminal of the second detection switch circuit is electrically connected with the second data line; and
a control terminal of the first detection switch circuit and a control terminal of the second detection switch circuit are configured to be electrically connected with a second test terminal;
wherein the peripheral region comprises a first region with a bonding region, a second region arranged opposite to the first region, and a third region and a fourth region that are connected with the first region and the second region and arranged opposite to each other;
the first terminal and the second terminal of the first crack detection line are located in the first region; the first crack detection line is located in the first region, the second region, and the third region; and
the first terminal of the second crack detection line is located in the second region, the second terminal of the second crack detection line is located in the first region, and the second crack detection line is located in the first region, the second region, and the third region.

2. The display panel according to claim 1, wherein, on a plane parallel to the display surface of the display panel, an orthogonal projection of the first crack detection line comprises an orthogonal projection of the second crack detection line.

3. The display panel according to claim 1, wherein
at least one third data line and at least one fourth data line are further arranged in the display region, the crack detection circuit structure further comprises a third crack detection line, a fourth crack detection line, a third detection switch circuit electrically connected with the third data line, and a fourth detection switch circuit electrically connected with the fourth data line, and the third crack detection line and the fourth crack detection line are arranged in different function layers of the display panel, wherein
a first terminal of the third crack detection line is electrically connected with a third test terminal, a second terminal of the third crack detection line is electrically connected with an input terminal of the third detection switch circuit, and an output terminal of the third detection switch circuit is electrically connected with the third data line;
a first terminal of the fourth crack detection line is electrically connected with a fourth node of the third crack detection line, the fourth node is different from the first terminal and the second terminal of the third crack detection line, a second terminal of the fourth crack detection line is electrically connected with an input terminal of the fourth detection switch circuit, and an output terminal of the fourth detection switch circuit is electrically connected with the fourth data line;
a control terminal of the third detection switch circuit and a control terminal of the fourth detection switch circuit are electrically connected with a fourth test terminal; and
the first crack detection line and the second crack detection line are located at one side of a central axis of the display panel, and the third crack detection line and the fourth crack detection line are located at the other side of the central axis of the display panel, wherein the central axis is a central axis between the third region and the fourth region.

4. The display panel according to claim 3, wherein the first terminal and the second terminal of the third crack detection line are located in the first region; the third crack detection line is located in the first region, the second region, and the fourth region; and
the first terminal of the fourth crack detection line is located in the second region, the second terminal of the fourth crack detection line is located in the first region, and the fourth crack detection line is located in the first region, the second region, and the fourth region.

5. The display panel according to claim 3, wherein, on a plane parallel to the display surface of the display panel, an orthogonal projection of the third crack detection line comprises an orthogonal projection of the fourth crack detection line.

6. The display panel according to claim 3, wherein the third crack detection line is arranged in the same layer as the first crack detection line, and the fourth crack detection line is arranged in the same layer as the second crack detection line.

7. The display panel according to claim 1, wherein the display panel further comprises a first sub-pixel connected with the first data line and a second sub-pixel connected with the second data line, wherein a color of the first sub-pixel is different from that of the second sub-pixel.

8. The display panel according to claim 1, wherein, on the plane perpendicular to the display surface of the display panel, the display panel comprises a display substrate and a touch structure layer that are sequentially arranged, wherein one of the first crack detection line and the second crack detection line is arranged in the same layer as any film layer_of the display substrate, and the other of the first crack detection line and the second crack detection line is arranged in the same layer as any film layer of the touch structure layer.

9. The display panel according to claim 8, wherein the first crack detection line is arranged in the same layer as any film layer of the touch structure layer, and the second crack detection line is arranged in the same layer as any film layer of the display substrate.

10. The display panel according to claim 8, wherein
the display substrate comprises a driving structure layer, the driving structure layer comprises an active layer, a first gate insulator, a first gate metal layer, a second gate insulator, a second gate metal layer, an interlayer insulating layer, and a source and drain metal layer, and the second crack detection line is arranged in the same layer as the source and drain metal layer;
or,
the display substrate comprises a driving structure layer, the driving structure layer comprises an active layer, a first gate insulator, a first gate metal layer, a second gate insulator, a second gate metal layer, an interlayer insulating layer, and a source and drain metal layer, and the second crack detection line is arranged in the same layer as the second gate metal layer.

11. The display panel according to claim 9, wherein the touch structure layer comprises a transfer metal layer, a touch insulating layer and a touch electrode layer, which are sequentially arranged, the first crack detection line is arranged in the same layer as the touch electrode layer, or, the first crack detection line is arranged in the same layer as the transfer metal layer.

12. A display device, comprising the display panel according to claim 1.

13. A crack detection method for a display panel, wherein the display panel is the display panel according to claim 1, and the display panel further comprises sub-pixels connected with the data lines, and the crack detection method comprises:
receiving a turn-on signal input from the second test terminal to turn on the first detection switch circuit and the second detection switch circuit, and receiving a test signal input from the first test terminal, wherein the test signal satisfies that a sub-pixel connected with a data line is in a first light emitting state when the test signal is loaded to the data line; and
determining crack state information of the display panel according to the light emitting state of the sub-pixel of the display panel.

14. The crack detection method for a display panel according to claim 13, wherein the determining crack state information of the display panel according to the light emitting state of the sub-pixel of the display panel comprises:
there being a crack between the first terminal and the third node of the first crack detection line when a sub-pixel connected with the first data line is in a second light emitting state and a sub-pixel connected with the second data line is in the second light emitting state;
there being no crack between the first terminal and the third node of the first crack detection line, a crack between the third node and the second terminal of the first crack detection line, and no crack between the first terminal and the second terminal of the second crack detection line when the sub-pixel connected with the first data line is in the second light emitting state and the sub-pixel connected with the second data line is in the first light emitting state; and
there being a crack between the first terminal and the second terminal of the second crack detection line and no crack between the first terminal and the second terminal of the first crack detection line when the sub-pixel connected with the first data line is in the first light emitting state and the sub-pixel connected with the second data line is in the second light emitting state;
wherein one of the first light emitting state and the second light emitting state is an on state, and the other of the first light emitting state and the second light emitting state is an off state.

15. The display panel according to claim 2, wherein the display panel further comprises a first sub-pixel connected with the first data line and a second sub-pixel connected with the second data line, wherein a color of the first sub-pixel is different from that of the second sub-pixel.

16. The display panel according to claim 3, wherein the display panel further comprises a first sub-pixel connected with the first data line and a second sub-pixel connected with the second data line, wherein a color of the first sub-pixel is different from that of the second sub-pixel.

17. The display panel according to claim 2, wherein, on the plane perpendicular to the display surface of the display panel, the display panel comprises a display substrate and a touch structure layer that are sequentially arranged, wherein one of the first crack detection line and the second crack detection line is arranged in the same layer as any film layer of the display substrate, and the other of the first crack detection line and the second crack detection line is arranged in the same layer as any film layer of the touch structure layer.

* * * * *

UNITED STATES PATENT AND TRADEMARK OFFICE
CERTIFICATE OF CORRECTION

| | |
|---|---|
| PATENT NO. | : 11,887,515 B2 |
| APPLICATION NO. | : 17/764991 |
| DATED | : January 30, 2024 |
| INVENTOR(S) | : Hao Zhang et al. |

It is certified that error appears in the above-identified patent and that said Letters Patent is hereby corrected as shown below:

In the Claims

Claim 11 should be as shown below:
11. The display panel according to claim 8, wherein the touch structure layer comprises a transfer metal layer, a touch insulating layer and a touch electrode layer, which are sequentially arranged, the first crack detection line is arranged in the same layer as the touch electrode layer, or, the first crack detection line is arranged in the same layer as the transfer metal layer.

Signed and Sealed this
Fifth Day of March, 2024

Katherine Kelly Vidal
*Director of the United States Patent and Trademark Office*